(12) United States Patent
Elsherbini et al.

(10) Patent No.: US 12,406,962 B2
(45) Date of Patent: Sep. 2, 2025

(54) POWER DELIVERY THROUGH CAPACITOR-DIES IN A MULTI-LAYERED MICROELECTRONIC ASSEMBLY

(71) Applicant: Intel Corporation, Santa Clara, CA (US)

(72) Inventors: Adel A. Elsherbini, Tempe, AZ (US); William J. Lambert, Chandler, AZ (US); Krishna Bharath, Phoenix, AZ (US); Shawna M. Liff, Scottsdale, AZ (US); Nicolas Butzen, Portland, OR (US); Georgios Dogiamis, Chandler, AZ (US); Gerald S. Pasdast, San Jose, CA (US); Vivek Kumar Rajan, Portland, OR (US); Sathya Narasimman Tiagaraj, San Jose, CA (US); Timothy Francis Schmidt, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/531,374

(22) Filed: Nov. 19, 2021

(65) Prior Publication Data
US 2023/0163098 A1    May 25, 2023

(51) Int. Cl.
| H01L 25/065 | (2023.01) |
| H01L 23/00 | (2006.01) |
| H01L 23/48 | (2006.01) |
| H01L 23/522 | (2006.01) |
| H01L 25/18 | (2023.01) |

(52) U.S. Cl.
CPC ........ *H01L 25/0652* (2013.01); *H01L 23/481* (2013.01); *H01L 23/5223* (2013.01); *H01L 24/08* (2013.01); *H01L 25/18* (2013.01); *H01L 2224/08145* (2013.01)

(58) Field of Classification Search
CPC ............... H01L 25/0652; H01L 25/18; H01L 2224/08145; H01L 25/16; H01L 23/481; H01L 23/5223; H01L 24/08; H01L 24/13; H01L 24/16; H01L 24/17; H01L 24/81; H01L 2225/06513; H01L 2225/06517; H01L 2225/06541; H01L 2225/06548
See application file for complete search history.

(56) References Cited

U.S. PATENT DOCUMENTS

| 2020/0098621 A1* | 3/2020 | Bharath | H01L 25/18 |
| 2020/0105653 A1* | 4/2020 | Elsherbini | H01L 23/642 |
| 2022/0077109 A1* | 3/2022 | Chava | H01L 25/0657 |
| 2022/0392881 A1* | 12/2022 | Yu | H01L 25/167 |

FOREIGN PATENT DOCUMENTS

| CN | 114582836 A * | 6/2022 | ........... H01L 21/304 |

* cited by examiner

*Primary Examiner* — Mamadou L Diallo
(74) *Attorney, Agent, or Firm* — Akona IP PC

(57) ABSTRACT

Embodiments of the present disclosure provide a microelectronic assembly comprising: an integrated circuit (IC) die in a first layer and a plurality of IC dies in a second layer, at least two adjacent IC dies in the plurality being electrically coupled along their proximate edges by the IC die. The first layer and the second layer are electrically and mechanically coupled by interconnects having a pitch of less than 10 micrometers between adjacent interconnects, and the IC die comprises capacitors and voltage regulator circuitry.

20 Claims, 9 Drawing Sheets

POWER DELIVERY THROUGH CAPACITOR-DIES IN A MULTI-LAYERED MICROELECTRONIC ASSEMBLY

TECHNICAL FIELD

The present disclosure relates to techniques, methods, and apparatus directed to power delivery through capacitor-dies in a multi-layered microelectronic assembly associated with semiconductor integrated circuit (IC) packaging technologies.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
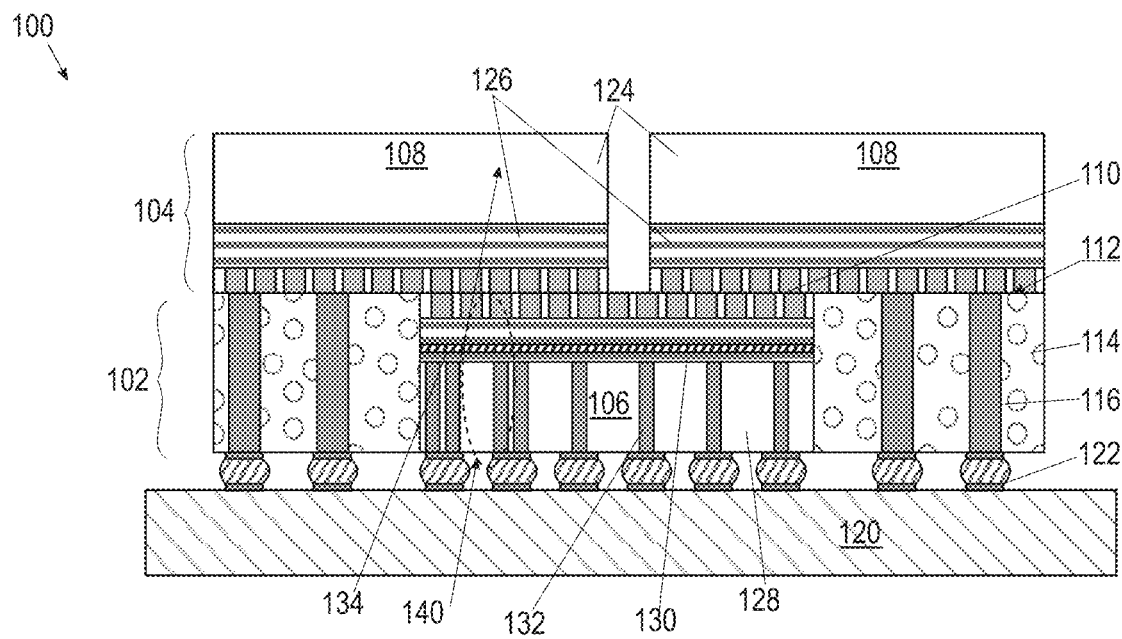
FIG. 1A is a simplified cross-sectional view of an example microelectronic assembly, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

In a general sense, today's ICs are manufactured with increasingly higher performance, reduced costs, and increased miniaturization of components and devices. Many ICs such as processors, controllers, logic devices, memory devices and the like may be housed in a package including a substrate which supports a semiconductor die (also called IC die) and which further has internal electrical connections to provide interconnections (i.e., power, ground, and data) to the die. The package includes external electrical connections to enable the package to be electrically connected to, for example, a socket that may be adapted on a circuit board such as a motherboard or the like.

For many electronic technologies, the drive toward smaller devices with greater functionality runs up against challenges in power delivery network (PDN) design. In a general sense, a typical PDN consists of all interconnections in a power supply pathway from voltage regulator modules to circuits, called herein as intellectual property (IP) cores on the die. For example, the PDN comprises printed circuit board (PCB) PDN, including voltage regulators (VRs) bulk decoupling capacitors, power, and ground planes, any intervening vias, traces and relevant leads, multi-layer ceramic capacitors; package PDN, including power ground shapes, vias, traces, solder balls, wire-bonds, package capacitors, etc. of various components in the IC packages, and die PDN, comprising on-die capacitors and power grid for IC dies electrically coupled together for a particular functionality. An "IP core" as used herein may include any number and any combination of memory, multiplexer, logic gate, register, arithmetic logic unit, datapath, microprocessor core, digital signal processor, random control logic, network processor, peripheral, input/output interfaces, and other circuits with particularized functionality and input/output interfaces such that a combination of such logic circuits suitably electrically coupled to each other enables the IC die in which the logic circuits are situated to function according to its intended purposes. Input/output interfaces can comprise registers for memory (e.g., double data rate (DDR) DDRx, low power DDR (LPDDR) LPDDRx), peripheral component interconnect express (PCIE) PCIEx, universal serial bus (USB) USBx, serial advanced technology attachment (SATA) SATAx, display, High-Definition Multimedia Interface (HDMI) HDMIx, phased lock loop (PLL), etc.

In particular, two correlated important requirements in heterogeneous integration in the area of high-performance computing associated with PDNs are: (1) ability to deliver high power to the IP cores with high overall efficiency and (2) ability to accommodate fast power transients with low voltage droop. These requirements can be accommodated through integrated voltage regulators and added on-core or near-core high frequency capacitors in a way that minimizes the cost while maintaining the needed performance.

Voltage regulators and metal-insulator-metal capacitors (MIM) capacitors may be integrated into the logic die comprising the IP core, however, such a configuration requires relatively expensive logic area and may impact the overall die yield. They may also be added as individual IC dies, for example, in a 3D stacked packaging architecture, such as Intel's omni-directional interconnect (ODI), which helps avoid the yield impact and allows using optimum technology for the voltage regulators. However, the organic dielectric in many of these 3D stacked packaging architectures can only accommodate low pitch interconnects (e.g., pitch greater than around 50 micrometers) between layers in the package, thereby preventing true 3D stacking.

In contrast, embodiments of the present disclosure provide a microelectronic assembly comprising: an IC die in a first layer and a plurality of IC dies in a second layer, at least two adjacent IC dies in the plurality being electrically coupled along their proximate edges by the IC die. The first layer and the second layer are electrically and mechanically coupled by interconnects having a pitch of less than 10 micrometers between adjacent interconnects, and the IC die comprises capacitors of a PDN in the microelectronic assembly.

In some embodiments, the interconnects between adjacent layers are distributed with silicon-level interconnect density. As used herein, the term "silicon-level" interconnect density comprises interconnect density greater than 10,000 connections per square millimeter. The term refers to trace pitch and/or via density that is generally found within an IC die (e.g., in metallization stacks of the IC die above the active region) as opposed to interconnect density between IC dies of older packaging technologies (e.g., solder-based C4 or larger interconnects). Interconnects with silicon-level interconnect density may have pitch ranging between 0.5 micrometer and 10 micrometers (i.e., in one embodiment, the interconnects may have a pitch of 0.5 micrometer; in another embodiment, the interconnects may have a pitch of 2 micrometer; etc.).

Embodiments of the present disclosure also provide an IC package comprising: a package substrate in a first layer; a first IC die in a second layer between the first layer and a third layer; and a second IC die and a third IC die in the third layer. The first IC die comprises capacitors, the first IC die electrically couples the second IC die and the third IC die, and the second layer and the third layer are electrically coupled by interconnects having a pitch of less than 10 micrometers between adjacent interconnects.

Embodiments of the present disclosure further provide an IC structure comprising: a metallization stack comprising a plurality of metal layers having conductive routing separated by an interlayer dielectric (ILD), the metal layers electrically coupled by conductive vias through the ILD; an inorganic substrate proximate to the metallization stack; a plurality of capacitors; and interconnects having a pitch of less than 10 micrometers proximate to the metallization stack. The IC structure is coupled by the interconnects in a multi-layered structure comprising IC dies distributed in several layers, and at least some IC dies in the multi-layered structure is surrounded by a dielectric and through-dielectric vias (TDVs).

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, silicon carbide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal-oxide semiconductor field-effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

In context of a stack of dies coupled to one another or in context of a die coupled to a package substrate, the term "interconnect" may also refer to, respectively, die-to-die (DTD) interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some, or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, some of all of the DTD interconnects may include hybrid bonds (e.g., metal-to-metal and oxide-to-oxide bonds), also called hybrid direct bonds, or direct bond interconnects. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one or more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity, and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photo-imageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
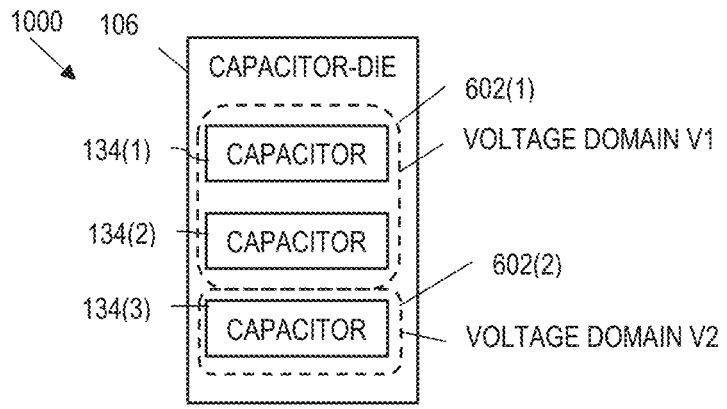
FIG. 10 is a is a simplified block diagram of yet another example arrangement among components of the microelectronic assembly, according to various embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a simplified top view of a microelectronic assembly 100 according to some embodiments of the present disclosure. Microelectronic assembly 100 comprises layers 102 and 104 having capacitor-die 106 (singly "capacitor-die 106" and collectively "capacitor-dies 106") and IC dies 108 (singly "IC die 108" and collectively "IC dies 108"), respectively. Capacitor-die 106 comprises an IC die having capacitors therein as described further. Although only few layers and IC dies are shown in the figure, it may be understood that microelectronic assembly 100 may comprise multiple such layers with multiple such IC dies therein. Capacitor-die 106 in layer 102 electrically couples at least two adjacent IC dies 108 in layer 104 along their proximate edges. In some embodiments, capacitor-die 106 functions as a bridge die, providing routing resources with silicon-level interconnection density to enable signals to travel between IC dies 108. In some other embodiments, capacitor-die 106 functions as more than a bridge die, providing additional functionalities, such as voltage regulation, for IC dies 108 in layer 104.

Layers 102 and 104 are electrically and mechanically coupled by DTD interconnects 110 having a pitch of less than 10 micrometers along a common interface 112. In some embodiments (e.g., as shown), DTD interconnects 110 may be disposed only between interconnected IC dies (e.g., capacitor-die 106 and IC dies 108); in other embodiments (not shown), DTD interconnects 110 may be disposed all along interface 112. Layer 102 (and in some embodiments, other layers, such as layer 104) may comprise a dielectric material 114 surrounding capacitor-die 106 therein. TDVs 116 may be disposed in dielectric material 114 suitably, for example, to enable power delivery directly from a package substrate 120 to IC dies 108 in layer 104.

In some embodiments, dielectric material 114 may comprise inorganic materials (e.g., silicon oxide, silicon carbonitride, silicon oxynitride, silicon nitride). In other embodiments, dielectric material 114 may comprise organic materials (e.g., mold compound, polyimide, epoxy resin). In such embodiments, TDVs 116 may also referred be to as through-mold vias (TMVs) where the material is mold compound. Although dielectric material 114 and TDVs 116 are shown in reference to layer 102, any other such layer in microelectronic assembly 100 may also comprise similar dielectric material 114 and TDVs 116. In various embodiments, selection of the material for dielectric material 114 may be appropriately based on recursive re-implementation and hierarchical coupling of microelectronic assembly 100. In some embodiments, dielectric material 114 may comprise silicon oxide, silicon nitride or other inorganic dielectric materials compatible with semiconductor manufacturing process. In some other embodiments, dielectric material 114 may alternatively comprise organic dielectric materials, such as polyimide materials, glass reinforced epoxy matrix materials, organic materials such as silica-filled epoxy, or a low-k or ultra-low-k dielectric (e.g., carbon-doped dielectrics, fluorine-doped dielectrics, porous dielectrics, organic polymeric dielectrics, photoimageable dielectrics, and/or benzocyclobutene-based polymers).

Package substrate 120 may be coupled to layer 102 by DTPS interconnects 122, which may comprise solder-based interconnections (as shown) or other types of interconnects as described previously. Although not shown so as not to clutter the drawings, one or more of layers 102 and 104 (and others where applicable) may comprise redistribution layers (RDL) comprising dielectric (e.g., polyimide, silicon oxide, silicon nitride) with electrical pathways therein to route or reroute between interconnects of a first pitch to interconnects of a different, second pitch. For example, such RDL may facilitate routing at an interface between layer 102 and 104 (e.g., to route between TDVs 116 in the respective layers.

In some embodiments, package substrate 120 may comprise an organic substrate; in other embodiments, package substrate 120 may comprise an inorganic interposer (e.g., made of glass, ceramic or semiconductor materials). In some embodiments, package substrate 120 may comprise multiple layers of conductive traces embedded in one or more layers of organic dielectric. For example, package substrate 120 may comprise a laminate substrate with several layers of metal planes or traces that are interconnected to each other by through-hole plated vias, with input/output (I/O) routing planes on the top and bottom layers, while the inner layers are used as a ground and power plane. In yet other embodiments, package substrate 120 may comprise a composite of organic and inorganic materials, for example, with an embedded semiconductor die in an organic substrate. In some embodiments, package substrate 120 may comprise an inorganic interposer with active circuits therein; in other embodiments, package substrate 120 may comprise an inorganic interposer with no active circuits therein.

In various embodiments, IC dies 108 may comprise an inorganic substrate 124, for example, a semiconductor, and a metallization stack 126, comprising a plurality of conductive metal routing separated by ILD and coupled by conductive vias in the ILD. Likewise, capacitor-die 106 may comprise an inorganic substrate 128 and a metallization stack 130 comprising a plurality of conductive metal routing separated by ILD and coupled by conductive vias in the ILD. Through-substrate vias (TSVs) 132 in substrate 128 may facilitate electrical coupling between DTPS interconnects 122 and interconnects 110 of capacitor-die 106. In various embodiments, TSV 132 may have a diameter of 12 micrometers and be disposed with a pitch of 180 micrometers. In the example embodiment shown, capacitor-die 106 is coupled to IC dies 108 in a face-to-face (FTF) configuration; various other configuration, for example, face-to-back (FTB) or back-to-back (BTB) configurations may also be used within the broad scope of the embodiments depending on particular needs, with TSVs providing electrical coupling through the respective substrates as appropriate.

According to various embodiments, capacitor-die 106 (also referred herein as capacitor-dies 106 in the plural) comprise capacitors 134. In a general sense, DTD interconnects 110 with pitch less than 10 micrometers enables a shorter routing path between IC dies 108 through capacitor-die 106 than with interconnects having larger pitch. If the size of capacitor-die 106 is determined based only on the length of the routing path between IC dies 108, then the resulting capacitor-die 106 may have a high aspect ratio (e.g., length-to-width ratio), causing difficulties in high-volume manufacturing, for example, in dicing, handling, etc. Hence, capacitor-dies 106 may be manufactured with greater width than is needed for bridging; such larger available area may be utilized for provisioning added functionalities, including capacitors 134. Cost-wise, provisioning capacitors 134 in capacitor-die 106 in layer 102 may be preferable to added capacitance on IC dies 108 that are typically high-performance, active devices with various cost, process steps and temperature limitations.

In some embodiments, capacitors 134 are part of a PDN in microelectronic assembly 100. Note that capacitance of capacitors 134 in capacitor-die 106 is not the same as parasitic capacitance in a conductive pathway. Parasitic capacitance, or stray capacitance, is an unavoidable and unwanted capacitance that exists between conductive parts of an electronic circuit simply because of proximity to each other within an electric field. Such parasitic capacitance is uncontrolled and non-programmable. In contrast, capacitors 134 are controlled, configured, designed, programmed, etc. to be part of a PDN or other circuit in microelectronic assembly 100.

Figure 1B:
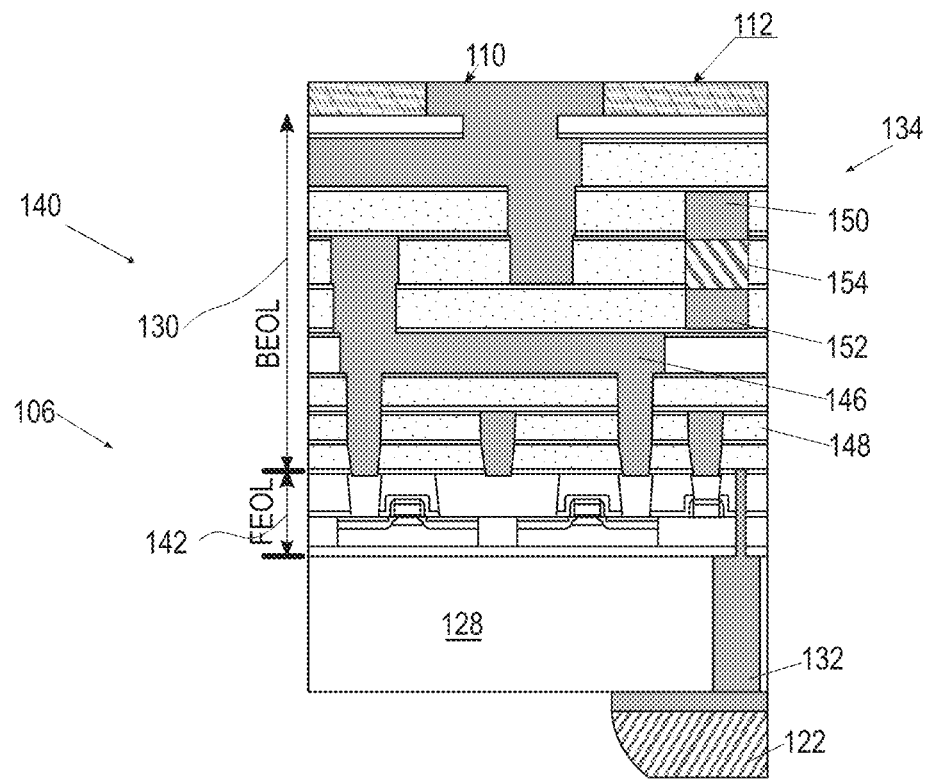
FIG. 1B illustrates details of a portion of the example microelectronic assembly of FIG. 1A, according to an embodiment of the present disclosure.

FIG. 1B illustrates a portion 140 of a cross-section of capacitor-die 106 in greater detail. In some embodiments, capacitor-die 106 may include an active region 142 (also called in the art as front-end-of-line (FEOL)) between metallization stack 130 (also called in the art as back-end-of-line (BEOL)) and substrate 128. Active region 142 comprises isolated transistors, diodes, and other active electronic components disposed over substrate 128. In some embodiments, active region 142 may be absent, and metallization stack 130 may be disposed directly over substrate 128.

Metallization stack 130 may include various layers of conductive routing 146 and ILD 148 comprising ILD layers, the layers of conductive routing 146 electrically coupled by conductive vias through ILD 148. Other materials or/and layers, not specifically shown in FIG. 1B may also be provided as may be known to those skilled in the art. Electrical signals, such as power and/or input/output (I/O) signals, may be routed to and/or from logic circuit elements (e.g., the transistors) of active region 142 through one or more conductive interconnect layers situated in metallization stack 130 including conductive routing 146, which may comprise one or more power grids (e.g., an arrangement of conductive lines, planes and vias, that is used to provide power), signal grids (e.g., an arrangement of conductive lines, planes and vias that is used to provide signals (e.g., data)), and/or ground grids (e.g., an arrangement of conductive lines, planes and vias that is used to provide ground connection).

In some embodiments, conductive routing 146 may include lines and/or vias filled with an electrically conductive material such as aluminum or copper. The lines comprising conductive routing 146 may be arranged to route electrical signals in a direction of a plane that is substantially parallel with a surface of substrate 128. For example, the lines may route electrical signals in a direction in and out of the page from the perspective of FIG. 1B. Vias may be arranged to route electrical signals in a direction of a plane that is substantially perpendicular to the surface of substrate 128. In some embodiments, the vias may electrically couple lines of different conductive routing layers together.

ILD layers of ILD 148 may be deposited over and in between conductive routing 146 of the metallization stack. The ILD layers may be formed using dielectric materials known for their applicability in IC structures, such as low-k dielectric materials. Examples of dielectric materials for ILD 148 include, but are not limited to, silicon dioxide ($SiO_2$), carbon-doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Note that ILD 148 may comprise a homogeneous material, or a heterogeneous layered composite comprising more than one layer of material, or a heterogeneous matrix comprising a mixture of materials in any suitable arrangement known in the art.

In various embodiments, TSV 132 may be disposed through active region 142 into portions of metallization stack 130, providing a conductive pathway from DTPS interconnects 122 through capacitor-die 106. TSV 132 may be electrically coupled to other components in capacitor-die 106, for example, to a power grid or a ground grid as appropriate, or to DTD interconnects 110. The electrical coupling may be achieved using suitable conductive routing 146.

In some embodiments (as shown), capacitor 134 may be situated in metallization stack 130, with vias in conductive routing 146 coupling capacitor 134 with IC dies 108 as appropriate through interconnects 110. In a general sense, the simplest type of capacitors consists of two overlapping parallel conductive plates separated by a dielectric. When a voltage difference is applied across the conductors, an electric field is created across the dielectric, which causes a positive charge to collect on one plate and a negative charge on the other plate. The capacitance (C) between the plates is a function of the area of the overlapping plates (A), the dielectric constant (E), and the distance (d) between the plates (C=EA/d); capacitance C is also the ratio of the electric charge (Q) on each conductor to the voltage difference (V) between them (C=Q/V). In various embodiments, capacitors 134, including their type, number, and location may be chosen, disposed, and/or otherwise fabricated based on the desired capacitance in the circuitry in which they are used.

In some embodiments, capacitor 134 may comprise a first electrode 150, separated from a second electrode 152 by a dielectric material 154. In various embodiments, first electrode 150 may be situated in one conductive routing layer in metallization stack 130 and second electrode 152 may be situated in an adjacent conductive routing layer in metallization stack 130. In other embodiments, first electrode 150 may be situated in one conductive routing layer in metallization stack 130 and second electrode 152 may be situated in a non-adjacent conductive routing layer in metallization stack 130. In some embodiments, dielectric material 154 may comprise the same material as ILD 148; in other embodiments, dielectric material 154 may comprise a material different from ILD 148.

In some embodiments, dielectric material 154 may include a material such as tantalum and oxygen (e.g., in the form of tantalum oxide), zirconium and oxygen (e.g., in the form of zirconium oxide), hafnium and oxygen (e.g., in the form of hafnium oxide), or titanium and oxygen (e.g., in the form of titanium oxide), or silicon and oxygen (e.g., in the form of silicon oxide); or carbon along with silicon and oxygen (e.g., in the form of carbon-doped silicon oxide); or tantalum and nitrogen (e.g., in the form of tantalum nitride); or a polymer such as benzocyclobutene (BCB); or inorganic amorphous materials such as phosphorus glass (PSG) and flurocarbon glass (FSG); or a combination of the above. In some embodiments, dielectric material 154 may include one or more layers of metal oxides (e.g., titanium oxide), for example, with layers having different dielectric constants. In some such embodiments, thickness of dielectric material 154 may be less than 100 nanometers. In some embodiments, dielectric material 154 may include an ultra-high-k material (e.g., a material having a dielectric constant greater than 120). In some such embodiments, dielectric material 154 may include barium, strontium, titanium, and oxygen (e.g., in the form of barium strontium titanate); or barium, titanium, and oxygen (e.g., in the form of barium titanate). Dielectric material 154 may be fabricated using any suitable technique for integrated capacitors known in the art, such as physical vapor deposition (PVD), chemical vapor deposition (CVD), and spin-on deposition (SOD).

Capacitor 134 may be disposed anywhere within capacitor-die 106 within the scope of the present disclosure. For example, in some embodiments, capacitor 134 may be disposed in metallization stack 130 closer to active region 142 than to DTD interconnects 110; in other embodiments, capacitor 134 may be disposed in metallization stack 130 closer to DTD interconnects 110 than to active region 142; in yet other embodiments, capacitor 134 may be disposed mid-way between active region 142 and DTD interconnects 110 in metallization stack 130. In some embodiments, capacitor 134 may be disposed in active region 142. In yet other embodiments, capacitor 134 may be disposed in substrate 128 proximate to DTPS interconnects 122. In some embodiments where capacitor-die 106 comprises a plurality of capacitors 134, some capacitors may be disposed in metallization stack 130 closer to DTD interconnects 110 than to active region 142, some other capacitors 134 may be disposed in metallization stack 130 closer to active region 142 than to DTD interconnects 110, yet other capacitors 134 may be disposed in active region 142 and still other capacitors 134 may be disposed in substrate 128, or in any other combination of such locations, depending on the number of capacitors 134, the functions or circuitry of which they are part, and other considerations based on particular needs.

In some embodiments, capacitors 134 may comprise MIM capacitors or metal-oxide-metal (MOM) capacitors, fabricated using processes known in the art. In other embodiments, capacitors 134 may comprise other types of capacitors, such as deep-trench capacitors (DTC). Any suitable type of capacitor known in the art and fabricated in an IC die may be used within the broad scope of the embodiments. In some embodiments, capacitors 134 in metallization stack 130 may comprise interdigitated conductive fingers as electrodes 150 and 152 in some embodiments; in other embodiments, capacitors 134 may comprise uniform sheets of metal as electrodes 150 and 152, punctured as needed for vias. In yet other embodiments, capacitors 134 may comprise corrugated conductors as electrodes 150 and 152.

Figure 1C:
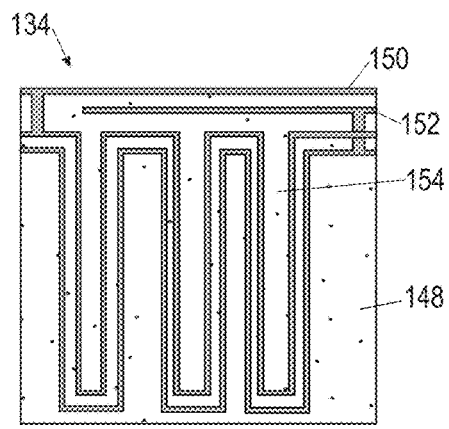
FIG. 1C illustrates details of a portion of the example microelectronic assembly of FIG. 1A, according to another embodiment of the present disclosure.

As shown in FIG. 1C, capacitor 134 disposed in metallization stack 130 may comprise a corrugated shape, and in such embodiments, may be referred to as a "corrugated capacitor." First electrode 150 may be electrically coupled to a power line, and second electrode 152 may be electrically coupled to a ground line in some embodiments, with dielectric material 154 comprising the same material as ILD 148. Corrugated capacitors have larger surface area for a given footprint than corresponding plate capacitors because of the undulating corrugated shape of the electrodes. In some embodiments, at least one capacitor 134 in capacitor-die 106 may comprise a conventional plate capacitor, where first electrode 150 and second electrode 152 are comprised of relatively flat and parallel layers of conductive material, and at least another capacitor 134 in capacitor-die 106 may comprise a corrugated capacitor.

Figure 1D:
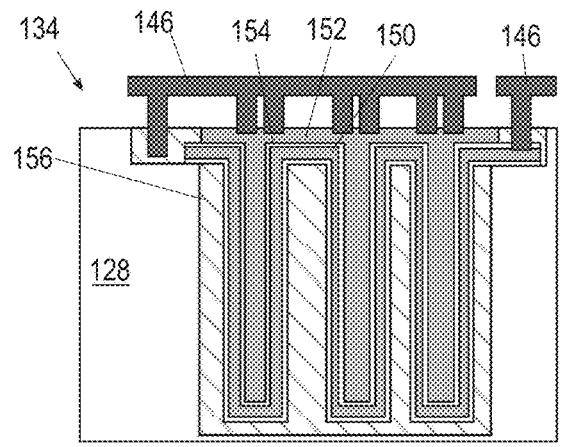
FIG. 1D illustrates details of a portion of the example microelectronic assembly of FIG. 1A, according to another embodiment of the present disclosure.

As shown in FIG. 1D, capacitor 134 may comprise a DTC disposed in part of substrate 128. In some embodiments, capacitor 134 comprising the DTC may be located in a region between metallization stack 130 and substrate 128 that does not comprise any active electronic components, such as didoes and transistors. In a general sense, the DTC known in the art is a three-dimensional vertical capacitor formed by etching a deep-trench into a silicon substrate, such as substrate 128. An advantage of using DTCs over package decoupling capacitors is that they can be freely placed as close as possible to the desired active device in active region 142. Additionally, DTCs may provide higher capacitance per unit area over other solutions such as a MIM capacitors. In capacitor 134 formed as a DTC, first electrode 150 may be coupled to conductive routing 146 coupled to a power grid and second electrode 152 may be coupled to conductive routing 146 coupled to a ground grid. In some embodiments, first electrode 150 and second electrode 152 may comprise different materials. For example, first electrode 150 may comprise arsenic-doped silicon, and second electrode 152 may comprise arsenic-doped polysilicon in some embodiments, with dielectric material 154 comprising any suitable high-k dielectric known in the art. In another embodiment, both first electrode 150 and second electrode 152 may comprise polysilicon. In some embodiments, first electrode 150 may be formed in a trench 156 comprising N-type semiconductor in a P-type substrate 128 (or vice versa), permitting capacitor 134 to be highly proximate to an active device to which it is electrically coupled, for example, by way of conductive routing 146.

Turning back to FIG. 1A, such a quasi-monolithic hierarchical architecture as depicted in the figure allows IC dies of disparate manufacturing technologies (e.g., technology node, or process node, or simply node) to be coupled together seamlessly within microelectronic assembly 100. In other words, microelectronic assembly 100 may allow heterogeneous integration. In a general sense, different processes often imply different circuit generations and architectures. Smaller (or more recent) the processing technology, smaller are the feature sizes, and consequently, the resulting transistors are both faster and more power efficient. For example, microelectronic assembly 100 may include IC die 108 manufactured using gallium nitride process, IC die 106 manufactured using 22 nm process and another IC die 108 manufactured using 45 nm process.

In some embodiments, one or more IC dies of microelectronic assembly 100 that are not constrained by any size limitations from any functional specifications may comprise any size, including ultra-small footprint less than 10 mm$^2$. In yet other embodiments, one or more IC dies in any layer except layer 202 may comprise other microelectronic assemblies, such as microelectronic assembly 100, in a recursive (e.g., nested, hierarchical) arrangement. For example, capacitor-die 106 may comprise structures and components substantially similar to microelectronic assembly 100. In yet other embodiments, one or more of the IC dies on any layer may comprise a plurality of semiconductor dies (e.g., IC dies) stacked one on top of another, electrically coupled with high-density DTD interconnects.

Figure 2:
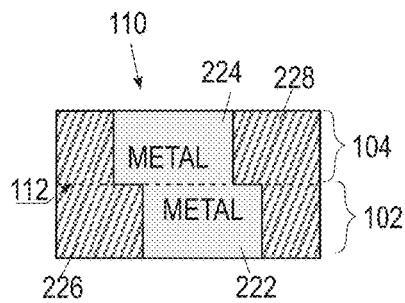
FIG. 2 is a simplified cross-sectional view of details of hybrid interconnects used in various embodiments of the microelectronic assembly according to the present disclosure.

FIG. 2 is a simplified cross-sectional view of a DTD interconnect 110 comprising a hybrid bond. The example applies to any DTD interconnect having pitch of less than 10 micrometers in the various embodiments disclosed herein. At interface 112 between layer 102 and layer 104, conductive contact 222 of layer 102 (e.g., belonging to capacitor-die 106) may bond with conductive contact 224 of layer 104 (e.g., belonging to IC die 108); likewise, dielectric material 226 (e.g., silicon oxide, silicon nitride, silicon oxynitride, etc.) in layer 102 (e.g., belonging to capacitor-die 106) may bond with dielectric material 228 (e.g., silicon oxide, silicon nitride, silicon oxynitride, etc.) in layer 104 (e.g., belonging to IC die 108). The bonded interconnects form DTD interconnects 110, comprising hybrid bonds, providing electrical and mechanical coupling between layer 102 and layer 104.

Figure 3:
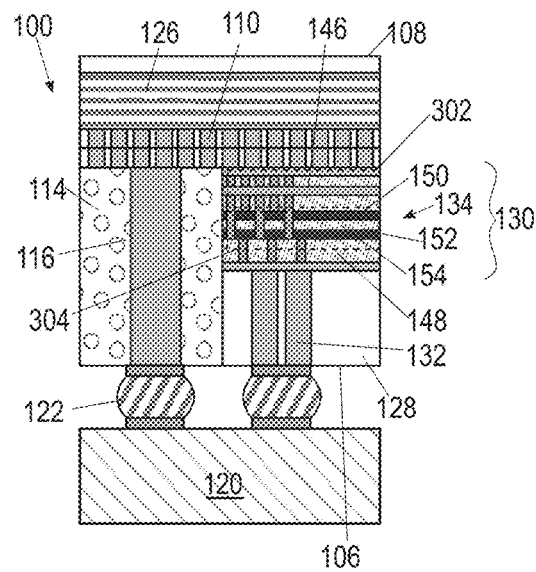
FIG. 3 is a simplified cross-sectional view of a portion of an example microelectronic assembly, according to various embodiments of the present disclosure.

FIG. 3 is a simplified cross-sectional view of microelectronic assembly 100 according to various embodiments of the present disclosure. In the example embodiment shown, capacitor-die 106 may be coupled in a FTF configuration, with metallization stack 126 of IC die 108 proximate to metallization stack 130. In some such embodiments, electrical pathways between IC dies 108 through capacitor-die 106 may be provisioned in a portion 302 of conductive routing 146 having a first pitch, and another portion 304 of conductive routing 146 may have a second pitch greater than the first pitch. For example, the first pitch may be 1 micrometer or smaller; the second pitch may be larger than 1 micrometer. In such embodiments, capacitor 134 may be provisioned in portion 304 having the second pitch. In the example embodiment shown, portion 302 is closer to interface 112 than portion 304. In other embodiments, portion 302 may be farther from interface 112 than portion 304.

Figure 4:
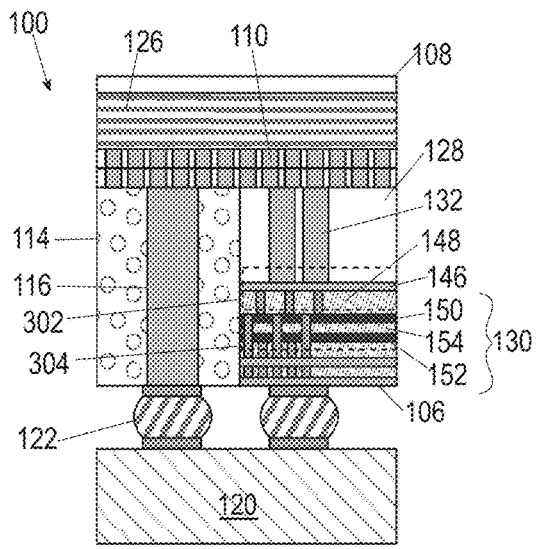
FIG. 4 is a simplified cross-sectional view of a portion of another example microelectronic assembly, according to various embodiments of the present disclosure.

FIG. 4 is a simplified cross-sectional view of microelectronic assembly 100 according to various embodiments of the present disclosure. In the example embodiment shown, capacitor-die 106 may be coupled in a FTB configuration, with metallization stack 126 of IC die 108 distant from metallization stack 130 and proximate to package substrate 120. In some such embodiments, electrical pathways between IC dies 108 through capacitor-die 106 may be provisioned through TSVs 132 and portion 302 of conductive routing 146 having the first pitch, which may be at a different location in capacitor-die 106 than in embodiments with the FTF configuration between IC dies 108 and capacitor-die 106, as shown in FIG. 3. Capacitor 134 may be provisioned in portion 304 having the second pitch, which may be greater than the first pitch. In the example embodiment shown, portion 302 is closer to interface 112 than portion 304. In other embodiments, portion 302 may be farther from interface 112 than portion 304.

In some embodiments, capacitors 134 may be disposed in capacitor-die 106 on both sides, for example, as shown in FIG. 3 and FIG. 4. In such embodiments, a first set of capacitors 134 may be proximate to a first side of capacitor-die 106, for example, the side coupled to IC dies 108 as in FIG. 3; a second set of capacitors 134 may be proximate to a second side of capacitor-die 106 opposite to the first side, for example, the side coupled to package substrate 120 as in FIG. 4. In some embodiments, the first set may support (e.g., operate at) a first voltage domain operating at a first voltage (e.g., 5V), and the second set may support a second voltage domain operating at a second voltage (e.g., 1.8V). Any number of voltages and corresponding voltage domains may be supported by different capacitors 134 in one or more capacitor-dies 106 in microelectronic assembly 100.

Figure 5A:
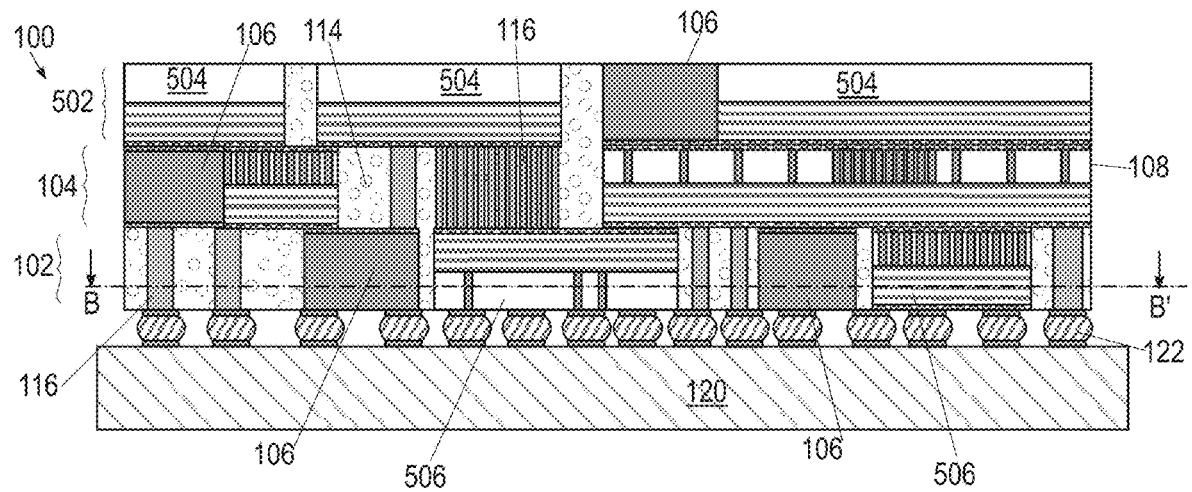
FIG. 5A is a simplified cross-sectional view of an example microelectronic assembly having capacitor-dies, according to various embodiments of the present disclosure.

FIG. 5A is a simplified cross-sectional view of a microelectronic assembly 100 according to various embodiments. Microelectronic assembly 100 comprises a layer 502 having IC dies 504 in addition to layers 102 and 104 as described in the embodiment of FIG. 1A. Capacitor-dies 106 having capacitors 134 are in layer 102 and also in layers 104 and 502. Further, IC dies 506 may be in layer 102 in addition to capacitor-die 106. Any number of such layers and IC dies may be comprised in microelectronic assembly 100 within the broad scope of the embodiments. Each layer 102, 104, 502, etc. may comprise dielectric material 114 and TDVs 116 therethrough. In some embodiments, the material of dielectric material 114 may be the same in all the layers; in other embodiments, the material of dielectric material 114 may be different.

In various embodiments, each one of capacitor-die 106 may comprise a capacitor-die having no electronic components other than capacitors 134. In some embodiments, capacitor-die 106 may also comprise on-die inductors with or without magnetic materials to enable improved process for power conversion efficiency, etc. In some embodiments, some of capacitor-dies 106 may also comprise voltage regulator circuitry (not shown so as not to clutter the drawings), whereas other capacitor-dies 106 may not comprise voltage regulator circuitry. In some embodiments, all capacitor-die 106 may comprise voltage regulator circuitry. In some embodiments, none of capacitor-die 106 having capacitors 134 may comprise voltage regulator circuitry.

Capacitor-dies 106 comprising capacitor-dies may be distributed laterally in any single layer (e.g., 102), and vertically among the layers (e.g., 102, 104, 502, etc.). Such placement of capacitor-dies 106 may help support high transient current for different kinds of workloads or provide additional capacitance for regulators that use capacitors.

Figure 5B:
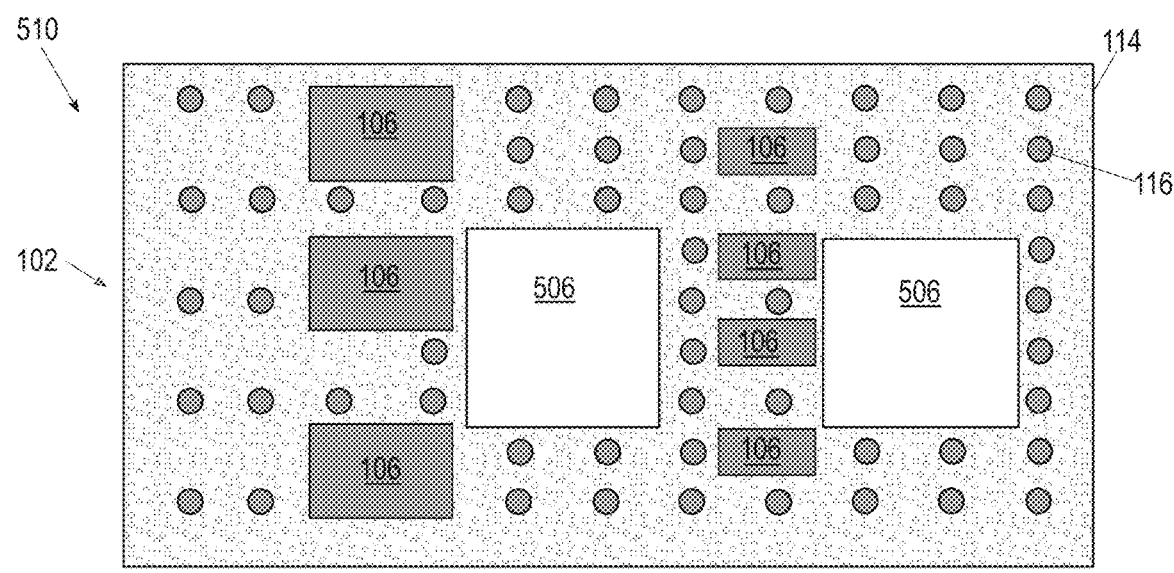
FIG. 5B is a simplified top view of the example microelectronic assembly of FIG. 5A, according to various embodiments of the present disclosure.

A top view of a plane 510 along axis BB' is shown in FIG. 5B, illustrating example placement of capacitor-dies 106 comprising capacitors 134 in layer 102 of microelectronic assembly 100. Note that the locations of capacitor-die 106 are shown merely for ease of explanation; capacitor-dies 106 may be provisioned anywhere in layer 102 (and other layers) based on particular needs. In some embodiments, capacitor-dies 106 may be provisioned as an array, for example, forming a capacitor array in any one layer (e.g., layer 102).

Figure 6:
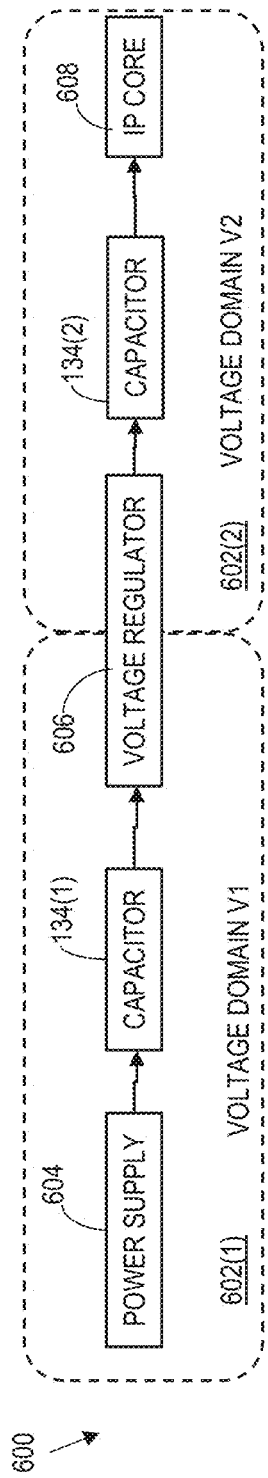
FIG. 6 is a simplified block diagram of an example power delivery network of the microelectronic assembly, according to various embodiments of the present disclosure.

FIG. 6 is a schematic block diagram of an example PDN 600 in microelectronic assembly 100 according to various embodiments of the present disclosure. PDN 600 may comprise at least two voltage domains 602: a first voltage domain 602(1) operating at a first voltage V1 (e.g., 5V, 7V, etc.) and a second voltage domain 602(2) operating at a second voltage V2 (e.g., 0.8V, 0.35V, etc.). A power supply 604 may supply power at first voltage V1 to a voltage regulator 606. Voltage regulator 606 may facilitate switching the voltage of the power from first voltage V1 to second voltage V2 of second voltage domain 602(2) at which an IP core 608 (e.g., logic circuit, memory, etc.) operates. IP core 608 may be provisioned in any IC die in microelectronic assembly 100, for example, IC dies 108, 505, 506, etc.

Voltage regulator 606 may be provisioned in one or more of IC dies 108, 504, 506, etc. In some embodiments, voltage regulator 606 may be provisioned in the same IC die as IP core 608. In other embodiments, voltage regulator 606 may be provisioned in an IC die different from IP core 608. In yet other embodiments, voltage regulator 606 may be provisioned in capacitor-die 106 having capacitors 134. In various embodiments, voltage regulator 606 may comprise circuitry corresponding to low drop-out (LDO) regulator, switched capacitor regulator or buck regulator in different embodiments, depending on the relative voltage values of V1 and V2, noise requirements, etc.

A first set of capacitors 134(1) in one or more capacitor-die 106 may comprise part of PDN 600 between power supply 604 and voltage regulator 606 in first voltage domain 602(1). A second set of capacitors 134(2) in one or more capacitor-die 106 may comprise part of PDN 600 between voltage regulator 606 and IP core 608 in second voltage domain 602(2). In some embodiments, first set of capacitors 134(1) and second set of capacitors 134(2) may be provisioned in the same capacitor-die 106. In other embodiments, first set of capacitors 134(1) and second set of capacitors 134(2) may be provisioned in different capacitor-dies 106 in the same layer (e.g., 102). In yet other embodiments, first set of capacitors 134(1) and second set of capacitors 134(2) may be provisioned in different capacitor-dies 106 in different layers (e.g., capacitors 134(1) in layer 102 and capacitors 134(2) in layer 104).

Figure 7:
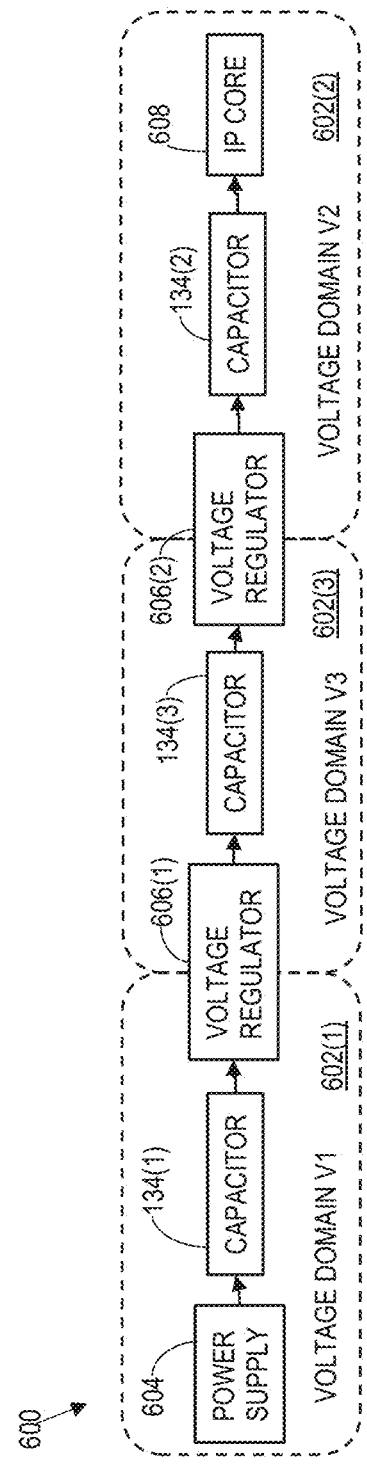
FIG. 7 is a simplified block diagram of another example power delivery network of the microelectronic assembly, according to various embodiments of the present disclosure.

FIG. 7 is a schematic block diagram of an example PDN 600 in microelectronic assembly 100 according to various embodiments of the present disclosure. PDN 600 may comprise at least three voltage domains 602: first voltage domain 602(1) operating at first voltage V1 (e.g., >30V, 5V, 7V, etc.), second voltage domain 602(2) operating at second voltage V2 (e.g., 2V, 1.8V, etc.), and a third voltage domain 602(3) operating at a third voltage V3 (e.g., 0.8V, 0.35V, etc.). Power supply 604 may supply power at first voltage V1 to first voltage regulator 606(1). Voltage regulator 606(1) may change the voltage level of the power from first voltage V1 to an intermediate third voltage V3. A second voltage regulator 606(2) may change the voltage level of the power from third voltage V3 to second voltage V2 at which IP core 608 operates. In some embodiments, voltage regulators 606(1) and 606(2) may be part of a two-stage voltage regulator circuitry in PDN 600. In other embodiments, voltage regulator 606(1) and 606(2) may be two separate voltage regulator circuitry in PDN 600.

Voltage regulators 606 (e.g., 606(1), 606(2)) may be provisioned in one or more of IC dies 108, 504, 506, etc. In some embodiments, voltage regulators 606 may be provisioned in the same IC die as IP core 608. In other embodiments, voltage regulators 606 may be provisioned in an IC die different from IP core 608. In yet other embodiments, voltage regulators 606 may be provisioned in capacitor-die 106 having capacitors 134. In various embodiments, voltage regulators 606 may comprise circuitry corresponding to LDO regulator, switched capacitor regulator or buck regulator in different embodiments, depending on the relative voltage values of V1 and V2, noise requirements, etc.

First set of capacitors 134(1) in one or more capacitor-die 106 may comprise part of PDN 600 between power supply 604 and first voltage regulator 606(1). Second set of capacitors 134(2) in one or more capacitor-die 106 may comprise part of PDN 600 between second voltage regulator 606(2) and IP core 608. A third set of capacitors 134(3) in one or more capacitor-die 106 may comprise part of PDN 600 between voltage regulators 606(1) and 606(2). In some embodiments, first set of capacitors 134(1), second set of capacitors 134(2), and third set of capacitors 134(3) may be provisioned in the same capacitor-die 106. In other embodiments, first set of capacitors 134(1), second set of capacitors 134(2) and third set of capacitors 134(3) may be provisioned in different capacitor-dies 106 in the same layer (e.g., 102). In yet other embodiments, first set of capacitors 134(1), second set of capacitors 134(2), and third set of capacitors 134(3) may be provisioned in different capacitor-dies 106 in different layers (e.g., capacitor-die 134(1) in layer 102 and capacitor-die 134(2) in layer 104).

In some embodiments, voltage regulator 606(1) may be provisioned in IC die 506 in layer 102; voltage regulator 606(2) may be provisioned in different IC die 108 in layer 104; capacitors 134(1), 134(2) and 134(3) may be provisioned in capacitor-die 106 in layer 102, and IP core 608 may be provisioned in IC die 504 in layer 502. Various other combinations are also possible with different IC dies in microelectronic assembly 100 within the broad scope of the embodiments. For example, in some embodiments, voltage regulators 606(1) and 606(2) may be provisioned in the same capacitor-die 106 as capacitors 134(1), 134(2) and 134(3) in layer 102; capacitor-die 106 may also function as a bridge die in some such embodiments, electrically coupling adjacent ones of IC dies 108 in layer 104.

Figure 8:
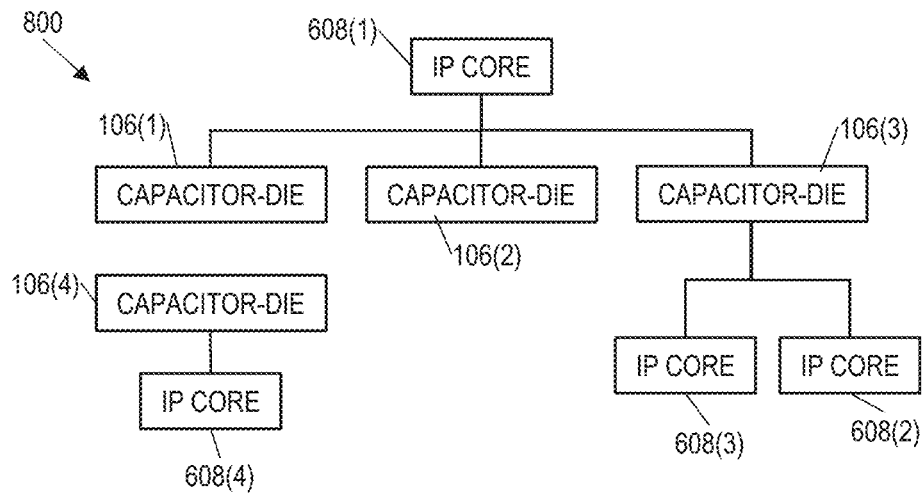
FIG. 8 is a simplified block diagram of an example arrangement among components of the microelectronic assembly, according to various embodiments of the present disclosure.

FIG. 8 is a simplified block diagram illustrating example configurations 800 of microelectronic assembly 100. Microelectronic assembly 100 comprises IP cores 608 and capacitor-dies 106. In some embodiments, any one IP core, for example, IP core 608(1) is coupled to multiple ones of the plurality of capacitor-dies, for example, 106(1), 106(2), and 106(3). In some embodiments, any one capacitor-die, for example, 106(3) is coupled to multiple IP cores, for example, 608(2) and 608(3). In some embodiments, any one IP core, for example, IP core 608(4) is coupled to a separate one of the plurality of capacitor-dies, for example 106(4). Various other combinations of numbers and relationships are possible between IP cores 608 and capacitor-dies 106 comprising capacitors 134 based on the number of capacitors, voltage domains, IP cores, etc. within the broad scope of the embodiments.

Figure 9:
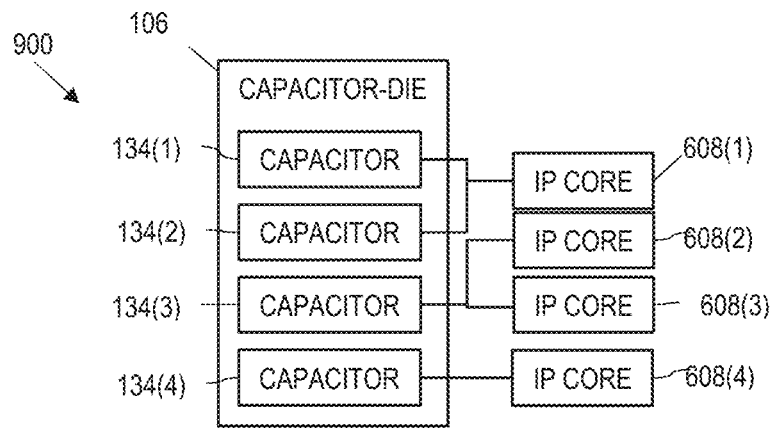
FIG. 9 is a simplified block diagram of another example arrangement among components of the microelectronic assembly, according to various embodiments of the present disclosure.

FIG. 9 is a simplified block diagram illustrating an example configuration 900 in microelectronic assembly 100 according to various embodiments. Capacitor-die 106 comprises a plurality of capacitors 134(1), 134(2), 134(3) and 134(4). Any number of capacitors 134 may be provisioned in capacitor-die 106 within the broad scope of the embodiments. Numerous IP cores 608, for example, 608(1), 608(2), 608(3) and 608(4) may be coupled to one or more capacitors 134 in capacitor-die 106 as described further. Any number of IP cores 608 may be provisioned in microelectronic assembly 100 without departing from the broad scope of the embodiments. In the example embodiment shown, any one IP core, for example, IP core 608(1) is coupled to multiple ones of capacitors, for example, 134(1), and 134(2). In some embodiments, any one capacitor, for example, 134(3) is coupled to multiple IP cores, for example, 608(2) and 608(3). In some embodiments, any one IP core, for example, IP core 608(4) is coupled to a separate of one of the plurality of capacitors, for example 134(4). Various other combinations of numbers and relationships are possible between IP cores 608 and capacitors 134 based on the number of capacitors, voltage domains, IP cores, etc. within the broad scope of the embodiments.

FIG. 10 is a simplified block diagram illustrating an example configuration 1000 in microelectronic assembly 100 according to various embodiments. Capacitor-die 106 comprises a plurality of capacitors 134(1), 134(2), and 134(3). Some capacitors, for example, 134(1) and 134(2) may support voltage domain 602(1) operating at first voltage V1, and some other capacitors, for example, 134(3) may support voltage domain 602(2) operating at second voltage V2. Various other combinations of numbers and relationships are possible between voltage domains 602 and capacitors 134 based on the different operating voltages, capacitors, voltage regulators, etc. in microelectronic assembly 100.

Figure 11:
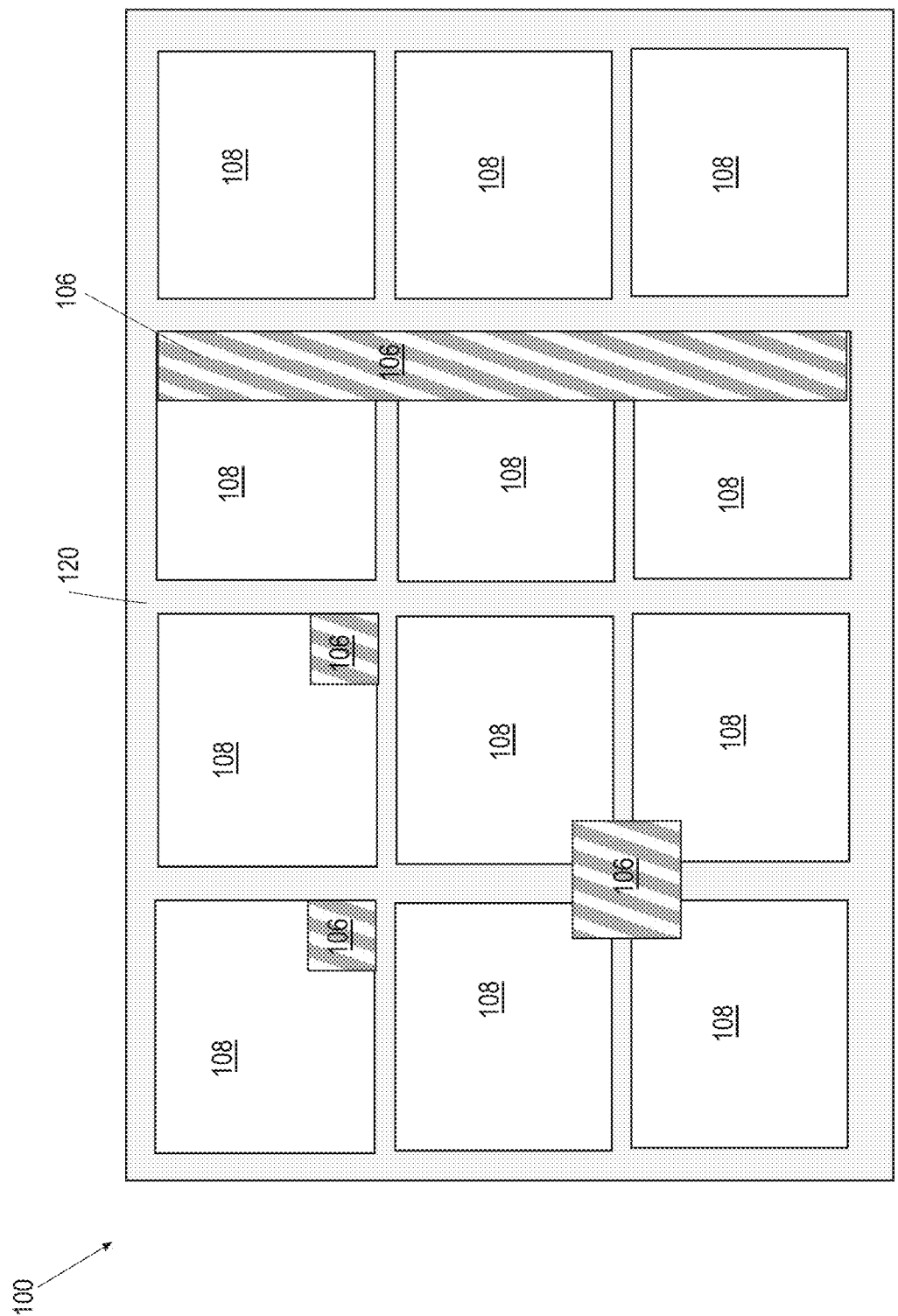
FIG. 11 is a simplified top view of an example configuration of the microelectronic assembly according to various embodiments of the present disclosure.

FIG. 11 is a simplified top view of an example embodiment of microelectronic assembly 100 according to embodiments of the present disclosure. Capacitor-dies 106 comprising capacitors 134 may be arranged in a one-to-one, many-to-one, and one-to-many relationship as appropriate with IC dies 108. IC dies 108 may comprise one or more IP cores (not shown), for example a processing element or memory. Some of capacitor-dies 106 may be provisioned in a one-to-one relationship with IC die 108, with a single capacitor-die 106 providing capacitors used by IP cores in IC die 108. Some capacitors-dies 106 may be shared among multiple ones of IC dies 108. For example, four adjacent IC dies 108 may share a single capacitor-die 106. In another example, three successively adjacent IC dies 108 may share a single capacitor-die 106 that spans across such IC dies 108. Various other combinations and configurations are possible within the broad scope of the embodiments. Although all the IC dies shown are IC dies 108, it may be noted that in other embodiments, IC dies 506, 508 etc., may also be provisioned suitably with capacitor-dies 106, based on particular needs and other considerations.

In various embodiments, any of the features discussed with reference to any of FIGS. 1-11 herein may be combined with any other features to form a package with one or more ICs as described herein, for example, to form a modified microelectronic assembly 100. Some such combinations are described above, but, in various embodiments, further combinations and modifications are possible.

Example Devices and Components

Figure 12:
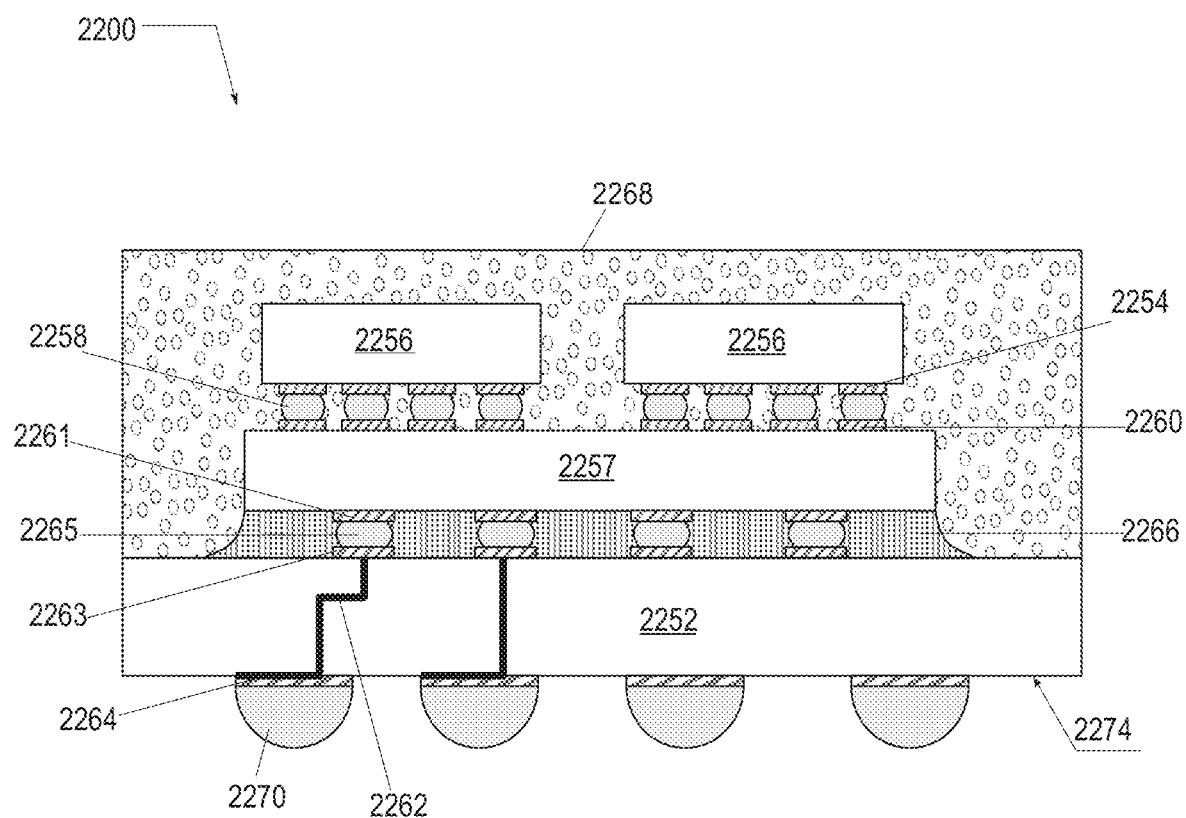
FIG. 12 is a cross-sectional view of a device package that includes one or more microelectronic assemblies in accordance with any of the embodiments disclosed herein.
Figure 13:
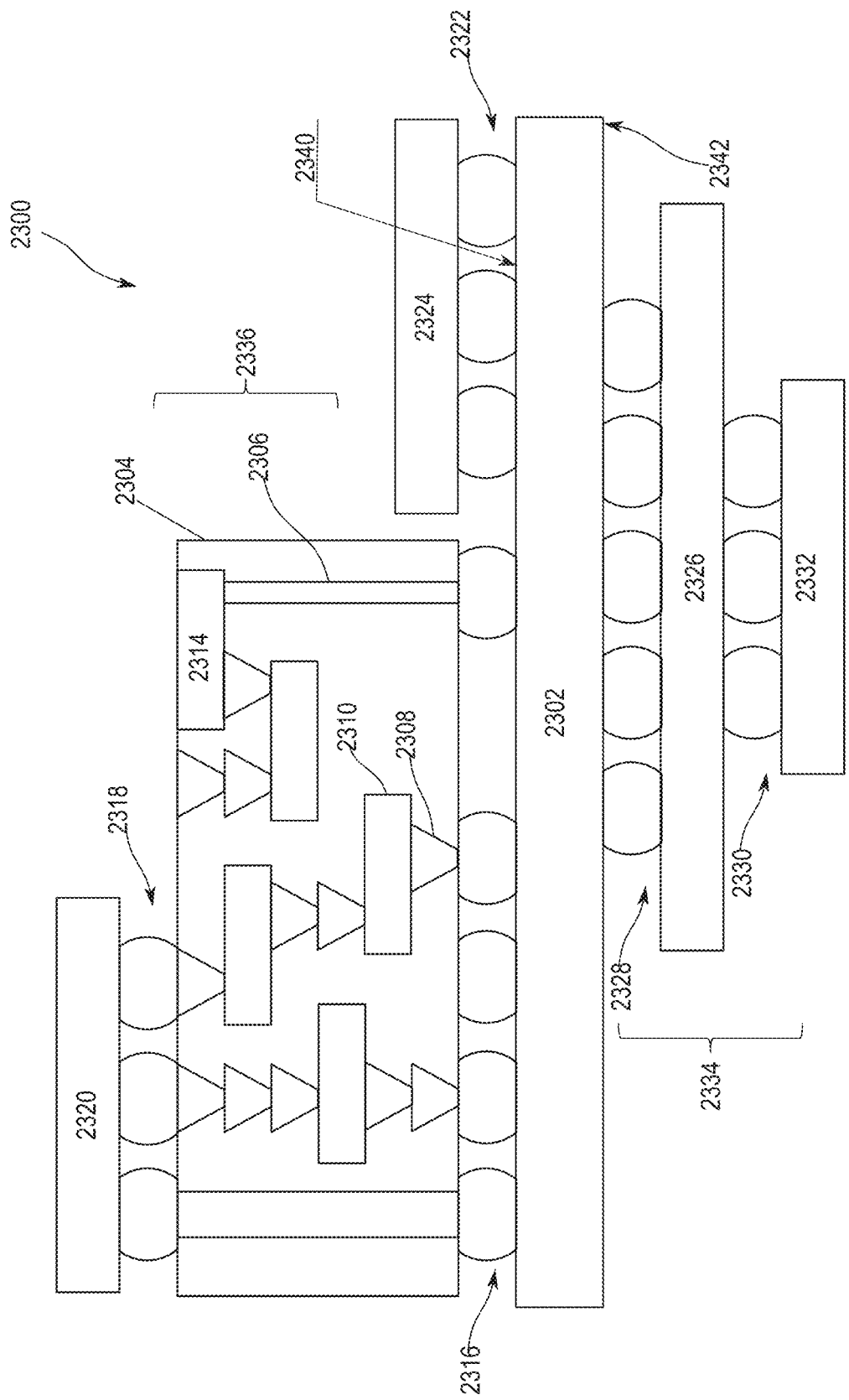
FIG. 13 is a cross-sectional side view of a device assembly that includes one or more microelectronic assemblies in accordance with any of the embodiments disclosed herein.
Figure 14:
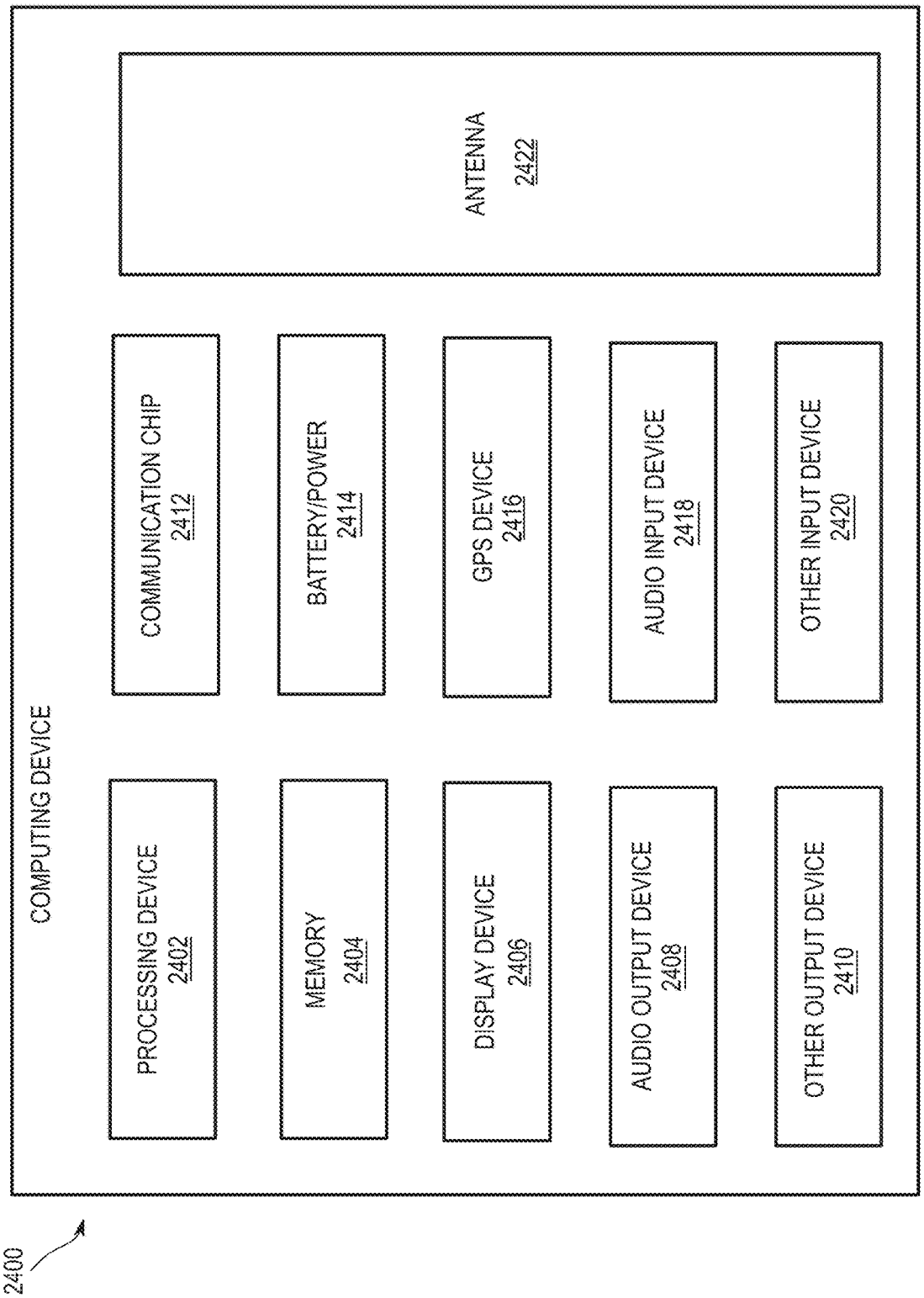
FIG. 14 is a block diagram of an example computing device that includes one or more microelectronic assemblies in accordance with any of the embodiments disclosed herein.

The packages disclosed herein, e.g., any of the embodiments shown in FIGS. 1-11 or any further embodiments described herein, may be included in any suitable electronic component. FIGS. 12-14 illustrate various examples of packages, assemblies, and devices that may be used with or include any of the IC packages as disclosed herein.

FIG. 12 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 13.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fanout (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 13 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 12.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 12. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 14 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 12). In yet another example, any one or more of the components of computing device 2400 may include an IC device assembly 2300 (e.g., as shown in FIG. 13).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random-access memory (eDRAM) or spin transfer torque magnetic random-access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100, FIG. 1A), comprising: an IC die (e.g., 106) in a first layer (e.g., 102); and a plurality of IC dies (e.g., 108) in a second layer (e.g., 104), at least two adjacent IC dies in the plurality being coupled by conductive pathways in the IC die, in which: the first layer and the second layer are electrically and mechanically coupled by interconnects (e.g., 110) having a pitch of less than 10 micrometers between adjacent interconnects, and the IC die comprises capacitors (e.g., 134) and voltage regulator circuitry.

Example 2 provides the microelectronic assembly of example 1, in which more than two adjacent IC dies in the plurality share the capacitors in the IC die.

Example 3 provides the microelectronic assembly of any one of examples 1-2, in which: the first layer comprises a dielectric material (e.g., 114) surrounding the IC die, and the first layer further comprises TDVs (e.g., 116) in the dielectric material.

Example 4 provides the microelectronic assembly of example 3, in which the dielectric material comprises an organic mold compound.

Example 5 provides the microelectronic assembly of example 3, in which the dielectric material comprises a compound of silicon and at least one of oxygen, carbon, and nitrogen.

Example 6 provides the microelectronic assembly of any one of examples 1-5, in which (e.g., FIGS. 6, 7): a first sub-set of the capacitors (e.g., 134(1)) is configured to operate at a first voltage, a second sub-set of the capacitors (e.g., 134(2)) is configured to operate at a second voltage, and the first voltage is higher than the second voltage.

Example 7 provides the microelectronic assembly of example 6, in which: the first sub-set of capacitors is coupled to a first voltage regulator (e.g., 606(1)), and the second sub-set of the capacitors is coupled to a second voltage regulator (e.g., 606(2)).

Example 8 provides the microelectronic assembly of any one of examples 1-7, in which the capacitors comprise metal-insulator-metal (MIM) capacitors embedded in a metallization stack of the IC die (e.g., FIG. 1B).

Example 9 provides the microelectronic assembly of any one of examples 1-7, in which the capacitors comprise corrugated capacitors embedded in a metallization stack of the IC die (e.g., FIG. 1C).

Example 10 provides the microelectronic assembly of any one of examples 1-7, in which the capacitors comprise DTC embedded in a substrate of the IC die (e.g., FIG. 1D).

Example 11 provides the microelectronic assembly of any one of examples 1-10, in which the capacitors comprise a capacitor array distributed in the IC die.

Example 12 provides the microelectronic assembly of any one of examples 1-11, in which the capacitors comprise decoupling capacitors of a PDN.

Example 13 provides the microelectronic assembly of any one of examples 1-12, in which (e.g., FIG. 5A): the IC die in the first layer comprises a first IC die, and a second IC die in the second layer comprises other capacitors of the PDN.

Example 14 provides the microelectronic assembly of example 13, in which (e.g., FIG. 5A): the interconnects comprise first interconnects, and the microelectronic assembly further comprises a third layer (e.g., 502) comprising a third IC die (e.g., 504) having yet other capacitors of the PDN, the first layer and the third layer being electrically and mechanically coupled by second interconnects having a pitch of less than 10 micrometers between adjacent ones of the second interconnects.

Example 15 provides the microelectronic assembly of example 14, in which the third layer is coupled to a package substrate.

Example 16 provides an IC package, comprising: a package substrate (e.g., 120) in a first layer; a first IC die (e.g., 106) in a second layer (e.g., 102); and a second IC die (e.g., 108) and a third IC die (e.g., 108) in a third layer (e.g., 104), in which: the second layer is between the first layer and the third layer, the first IC die comprises capacitors, conductive pathways in the first IC die couples the second IC die and the third IC die, and the second layer and the third layer are electrically and mechanically coupled by interconnects (e.g., 110) having a pitch of less than 10 micrometers between adjacent interconnects.

Example 17 provides the IC package of example 16, in which the second layer comprises a dielectric material with TDVs around the second IC die.

Example 18 provides the IC package of any one of examples 16-17, further comprising a fourth layer between the first layer and the second layer, the fourth layer comprising a fourth IC die that includes other capacitors.

Example 19 provides the IC package of example 18, in which the fourth layer comprises a dielectric material with TDVs around the fourth IC die.

Example 20 provides the IC package of any one of examples 18-19, further comprising a fifth IC die in the third layer, the fifth IC die comprising further capacitors.

Example 21 provides the IC package of any one of examples 16-20, in which the capacitors are in at least one of a metallization stack (e.g., 130) and a substrate (e.g., 128) of the first IC die.

Example 22 provides the IC package of example 21, in which (e.g., FIG. 3): the metallization stack of the first IC die is proximate to the second IC die and the third IC die, and vias in the metallization stack of the first IC die are configured to electrically couple the capacitors to the second IC die and the third IC die.

Example 23 provides the IC package of example 21, in which (e.g., FIG. 4): the metallization stack of the first IC die is proximate to the package substrate, and TSVs in the first IC die and vias in the metallization stack of the first IC die are configured to electrically couple the capacitors to the second IC die and the third IC die.

Example 24 provides the IC package of any one of examples 21-23, in which the capacitors comprise at least one of: MIM capacitors and corrugated capacitors in the metallization stack.

Example 25 provides the IC package of any one of examples 21-23, in which the capacitors comprise deep-trench capacitors in the substrate.

Example 26 provides an IC structure, comprising (e.g., FIGS. 1A, 1B): a metallization stack (e.g., 130) comprising a plurality of layers of conductive routing (e.g., 146) separated by an ILD (e.g., 148), the plurality of layers of conductive traces being coupled by conductive vias through the ILD; an inorganic substrate (e.g., 128) proximate to the metallization stack; a plurality of capacitors (e.g., 134); and interconnects (e.g., 110) having a pitch of less than 10 micrometers proximate to the metallization stack, in which: the IC structure is coupled by the interconnects in a multi-layered structure (e.g., 100) comprising IC dies distributed in several layers (e.g., 102, 104), and at least some IC dies in the multi-layered structure is surrounded by a dielectric material (e.g., 114) and TDVs (e.g., 116).

Example 27 provides the IC structure of example 26, in which: the interconnects comprise a first set of interconnects, the IC structure further comprises a second set of interconnects distant from the metallization stack, and the second set of interconnects is coupled to the metallization stack by TSVs (e.g., 132) through the inorganic substrate.

Example 28 provides the IC structure of any one of examples 26-27, in which at least one of the capacitors comprises a MIM capacitor.

Example 29 provides the IC structure of example 28, in which: a first portion of the metallization stack comprises first conductive traces having a first pitch between adjacent ones of the first conductive traces, a second portion of the metallization stack comprises second conductive traces having a second pitch between adjacent ones of the second conductive traces, the second pitch is larger than the first pitch, and the MIM capacitor is in the second portion.

Example 30 provides the IC structure of any one of examples 26-29, in which: a first sub-set of the capacitors is configured to operate in a first voltage domain, the first sub-set of the capacitors is proximate to a first side of the IC structure, a second sub-set of the capacitors is configured to operate in a second voltage domain, the second sub-set of the capacitors is proximate to a second side of the IC structure opposite to the first side, and the first voltage domain is configured to operate at a different voltage than the second voltage domain.

Example 31 provides the IC structure of any one of examples 26-30, in which: a voltage regulation circuitry on one or more IC dies in the multi-layered structure is coupled to one or more of the plurality of capacitors, and the voltage regulation circuitry comprises at least one of a low drop-out regulator, a switched capacitor regulator and a buck regulator.

Example 32 provides the IC structure of example 31, in which: the voltage regulation circuitry comprises at least two stages, a first stage is configured to convert from a first voltage to a second voltage, the first stage is in a first IC die in the multi-layered structure, a second stage is configured to convert from the second voltage to a third voltage, the second stage is in a second IC die in the multi-layered structure, and the first IC die and the second IC die are coupled to the plurality of capacitors in the IC structure.

Example 33 provides the IC structure of any one of examples 26-32, in which at least one of the capacitors comprises a corrugated capacitor in the metallization stack.

Example 34 provides the IC structure of any one of examples 26-32, in which: the inorganic substrate comprises a semiconductor material, and at least one of the capacitors comprises a deep-trench capacitor in the inorganic substrate.

Example 35 provides the IC structure of any one of examples 26-34, in which: a first capacitor in the plurality of capacitors is configured to operate at a first voltage, and a second capacitor in the plurality of capacitors is configured to operate at a second voltage different from the first voltage.

Example 36 provides a microelectronic assembly, comprising (e.g., FIG. 5A): a plurality of IC dies in a layer, a sub-set of the IC dies comprising IP cores; and a plurality of capacitor-dies (e.g., 106) in one or more other layers, in which: adjacent layers are electrically and mechanically coupled by interconnects having a pitch of less than 10 micrometers between adjacent interconnects, and each capacitor-die in the plurality of capacitor-dies comprises an IC die having capacitors.

Example 37 provides the microelectronic assembly of example 36 (e.g., FIG. 8), in which one of the IP cores (e.g., 608(4)) is coupled to a separate of one of the plurality of capacitor-dies (e.g., 106(4)).

Example 38 provides the microelectronic assembly of example 36 (e.g., FIG. 8), in which one of the IP cores (e.g., 608(1)) is coupled to multiple ones of the plurality of capacitor-dies (e.g., 106(1)-106(3)).

Example 39 provides the microelectronic assembly of example 36 (e.g., FIG. 8), in which one of the capacitor-dies (e.g., 106(3)) is coupled to multiple IP cores (e.g., 608(2), 608(3)).

Example 40 provides the microelectronic assembly of any one of examples 36-39, further comprising at least one capacitor-die in the layer.

Example 41 provides the microelectronic assembly of any one of examples 36-40, in which: a first sub-set of the plurality of capacitor-dies is configured to operate at a first voltage, and a second sub-set of the plurality of capacitor-dies is configured to operate at a second voltage different from the first voltage.

Example 42 provides the microelectronic assembly of any one of examples 36-41, in which: a first sub-set of capacitors in at least one capacitor-die is configured to operate at a first voltage, and a second sub-set of capacitors in the at least one capacitor-die is configured to operate at a second voltage different from the first voltage.

Example 43 provides the microelectronic assembly of any one of examples 36-43, in which at least one of the one or more other layers comprises more than one capacitor-die.

Example 44 provides the microelectronic assembly of any one of examples 36-43, in which: the microelectronic assembly comprises two or more other layers, and the plurality of capacitor-dies is laterally and vertically distributed across the two or more other layers.

Example 45 provides the microelectronic assembly of any one of examples 36-44, in which the capacitor-dies comprise no active devices, nor any passive components other than capacitors.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
an integrated circuit (IC) die in a first layer; and
a plurality of IC dies in a second layer, at least two adjacent IC dies in the plurality being coupled by conductive pathways in the IC die,
wherein:
the first layer and the second layer are coupled by interconnects, and
the IC die comprises capacitors and voltage regulator circuitry.

2. The microelectronic assembly of claim 1, wherein:
the first layer comprises a dielectric material at least partially surrounding the IC die, and
the first layer further comprises through-dielectric vias (TDVs) in the dielectric material.

3. The microelectronic assembly of claim 2, wherein the dielectric material comprises a compound of silicon and at least one of oxygen, carbon, or nitrogen.

4. The microelectronic assembly of claim 1, wherein:
a first sub-set of the capacitors is to operate at a first voltage,
a second sub-set of the capacitors is to operate at a second voltage, and
the first voltage is higher than the second voltage.

5. The microelectronic assembly of claim 4, wherein:
the first sub-set of capacitors is coupled to a first voltage regulator, and
the second sub-set of the capacitors is coupled to a second voltage regulator.

6. The microelectronic assembly of claim 1, wherein the capacitors comprise metal-insulator-metal (MIM) capacitors embedded in a metallization stack of the IC die.

7. The microelectronic assembly of claim 1, wherein the capacitors comprise corrugated capacitors embedded in a metallization stack of the IC die.

8. The microelectronic assembly of claim 1, wherein the capacitors comprise deep-trench capacitors (DTC) embedded in a substrate of the IC die.

9. The microelectronic assembly of claim 1, wherein the interconnects have a pitch of less than 10 micrometers between adjacent interconnects.

10. An IC package, comprising:
a package substrate in a first layer;
a first IC die in a second layer;
a second IC die and a third IC die in a third layer; and
a fourth IC die in a fourth layer,
wherein:
the second layer is between the first layer and the third layer,
the fourth layer is between the first layer and the second layer,
the first IC die includes capacitors,
the fourth IC die includes other capacitors,
conductive pathways in the first IC die couples the second IC die and the third IC die, and
the second layer and the third layer are coupled by interconnects having a pitch of less than 10 micrometers between adjacent interconnects.

11. The IC package of claim 10, wherein the capacitors are in at least one of a metallization stack and a substrate of the first IC die.

12. The IC package of claim 11, wherein:
the metallization stack of the first IC die is proximate to the second IC die and the third IC die, and
vias in the metallization stack of the first IC die are to couple the capacitors to the second IC die and the third IC die.

13. The IC package of claim 11, wherein:
the metallization stack of the first IC die is proximate to the package substrate, and
through-substrate vias (TSVs) in the first IC die and vias in the metallization stack of the first IC die are to couple the capacitors to the second IC die and the third IC die.

14. An IC structure, comprising:
a metallization stack comprising a plurality of layers of conductive traces separated by a first dielectric material, and further comprising conductive vias in the first dielectric material;
an inorganic substrate proximate to the metallization stack;
a plurality of capacitors; and
interconnects proximate to the metallization stack,
wherein:
the IC structure is coupled by the interconnects in a multi-layered structure comprising IC dies distributed in two or more layers, and
at least one of the IC dies is surrounded by a second dielectric material and through-dielectric vias (TDVs) in the second dielectric material.

15. The IC structure of claim 14, wherein at least one of the capacitors comprises a metal-insulator-metal (MIM) capacitor.

16. The IC structure of claim 15, wherein:
a first portion of the metallization stack comprises first conductive traces having a first pitch,
a second portion of the metallization stack comprises second conductive traces having a second pitch,
the second pitch is larger than the first pitch, and
the MIM capacitor is in the second portion.

17. The IC structure of claim 14, wherein:
a first sub-set of the capacitors is to operate at a first voltage, the first sub-set of the capacitors is proximate to a first side of the IC structure, a second sub-set of the capacitors is to operate at a second voltage, the second sub-set of the capacitors is proximate to a second side of the IC structure opposite to the first side, and the first voltage is different from the second voltage.

18. The IC structure of claim 14, wherein:

a voltage regulation circuitry on one or more IC dies in the multi-layered structure is coupled to one or more of the plurality of capacitors, and the voltage regulation circuitry comprises at least one of a low drop-out regulator, a switched capacitor regulator and a buck regulator.

19. The IC structure of claim 18, wherein:

the voltage regulation circuitry comprises at least two stages, a first stage is to convert from a first voltage to a second voltage, the first stage is in a first IC die in the multi-layered structure, a second stage is to convert from the second voltage to a third voltage, the second stage is in a second IC die in the multi-layered structure, and the first IC die and the second IC die are coupled to the plurality of capacitors in the IC structure.

20. The IC structure of claim 14, wherein the interconnects have a pitch of less than 10 micrometers.

* * * * *